(12) United States Patent
Moosburger et al.

(10) Patent No.: US 10,763,396 B2
(45) Date of Patent: Sep. 1, 2020

(54) LIGHT-EMITTING MODULE AND DISPLAY DEVICE COMPRISING SAME

(71) Applicant: OSRAM OLED GMBH, Regensburg (DE)

(72) Inventors: Jürgen Moosburger, Lappersdorf (DE); Matthias Sabathil, Regensburg (DE); Frank Singer, Regenstauf (DE)

(73) Assignee: OSRAM OLED GMBH, Regensburg (DE)

( * ) Notice: Subject to any disclaimer, the term of this patent is extended or adjusted under 35 U.S.C. 154(b) by 121 days.

(21) Appl. No.: 16/086,828

(22) PCT Filed: Mar. 29, 2017

(86) PCT No.: PCT/EP2017/057434
§ 371 (c)(1),
(2) Date: Sep. 20, 2018

(87) PCT Pub. No.: WO2017/167812
PCT Pub. Date: Oct. 5, 2017

(65) Prior Publication Data
US 2019/0103516 A1   Apr. 4, 2019

(30) Foreign Application Priority Data

Apr. 1, 2016   (DE) .................. 10 2016 105 989

(51) Int. Cl.
*H01L 33/50*   (2010.01)
*H01L 33/24*   (2010.01)
(Continued)

(52) U.S. Cl.
CPC ............ *H01L 33/24* (2013.01); *H01L 27/153* (2013.01); *H01L 33/502* (2013.01); *H05B 45/00* (2020.01);
(Continued)

(58) Field of Classification Search
CPC ... H01L 27/153; H01L 33/502; H01L 33/504; H01L 33/54; H01L 33/56; H01L 33/62
See application file for complete search history.

(56) References Cited

U.S. PATENT DOCUMENTS 7,423,617 B2   9/2008  Giraldo et al.
8,777,432 B2   7/2014  Mayer
(Continued)

FOREIGN PATENT DOCUMENTS

EP   2552178 A1   1/2013
JP   2005259724 A   9/2005
(Continued)

*Primary Examiner* — Cuong Q Nguyen
(74) *Attorney, Agent, or Firm* — Slater Matsil, LLP

(57) ABSTRACT

A light-emitting module and a display device including the same are disclosed. In an embodiment a light-emitting module includes a plurality of emission regions configured to emit light, at least one first emission region and at least one second emission region of a first type configured to emit light of a first color locus and at least one first emission region and at least one second emission region of a second type configured to emit light of a second color locus and a control device for supplying the emission regions with current, wherein the emission regions are arranged on a common semiconductor chip, wherein the first color locus is different from the second color locus, wherein the first and second emission regions of the first type are adjacent to one another, and wherein the first and second emission regions of the second type are adjacent to one another.

15 Claims, 8 Drawing Sheets

(51) Int. Cl.
  *H01L 27/15*    (2006.01)
  *H05B 45/00*    (2020.01)
  *H05B 45/58*    (2020.01)
  *H01L 25/075*   (2006.01)

(52) U.S. Cl.
  CPC .......... *H05B 45/58* (2020.01); *H01L 25/0753* (2013.01); *H01L 27/156* (2013.01); *H01L 33/504* (2013.01); *H01L 33/508* (2013.01)

(56) References Cited

U.S. PATENT DOCUMENTS

| | | | |
|---|---|---|---|
| 8,914,246 B2 | 12/2014 | Chaji et al. | |
| 9,192,021 B2 | 11/2015 | Hafner et al. | |
| 2005/0174420 A1 | 8/2005 | Hayashi | |
| 2005/0179675 A1 | 8/2005 | Hekstra et al. | |
| 2010/0109575 A1 | 5/2010 | Ansems et al. | |
| 2012/0147293 A1 | 6/2012 | Dunn | |
| 2013/0207964 A1 | 8/2013 | Fleck et al. | |
| 2013/0258636 A1* | 10/2013 | Rettke | H01L 33/502 362/84 |
| 2014/0139499 A1 | 5/2014 | Hussain et al. | |
| 2015/0362165 A1 | 12/2015 | Chu et al. | |
| 2015/0371585 A1 | 12/2015 | Bower et al. | |
| 2016/0190110 A1 | 6/2016 | Göötz et al. | |
| 2017/0236982 A1* | 8/2017 | Akiyama | H01L 33/54 315/185 R |
| 2018/0249549 A1* | 8/2018 | Kim | H05B 45/40 |

FOREIGN PATENT DOCUMENTS

| | | |
|---|---|---|
| JP | 2005527861 A | 9/2005 |
| JP | 2007041574 A | 2/2007 |
| JP | 2013512473 A | 4/2013 |
| JP | 2016512347 A | 4/2016 |
| KR | 20050084636 A | 8/2005 |
| WO | 2012045684 A1 | 4/2012 |
| WO | 2015024801 A1 | 2/2015 |

* cited by examiner

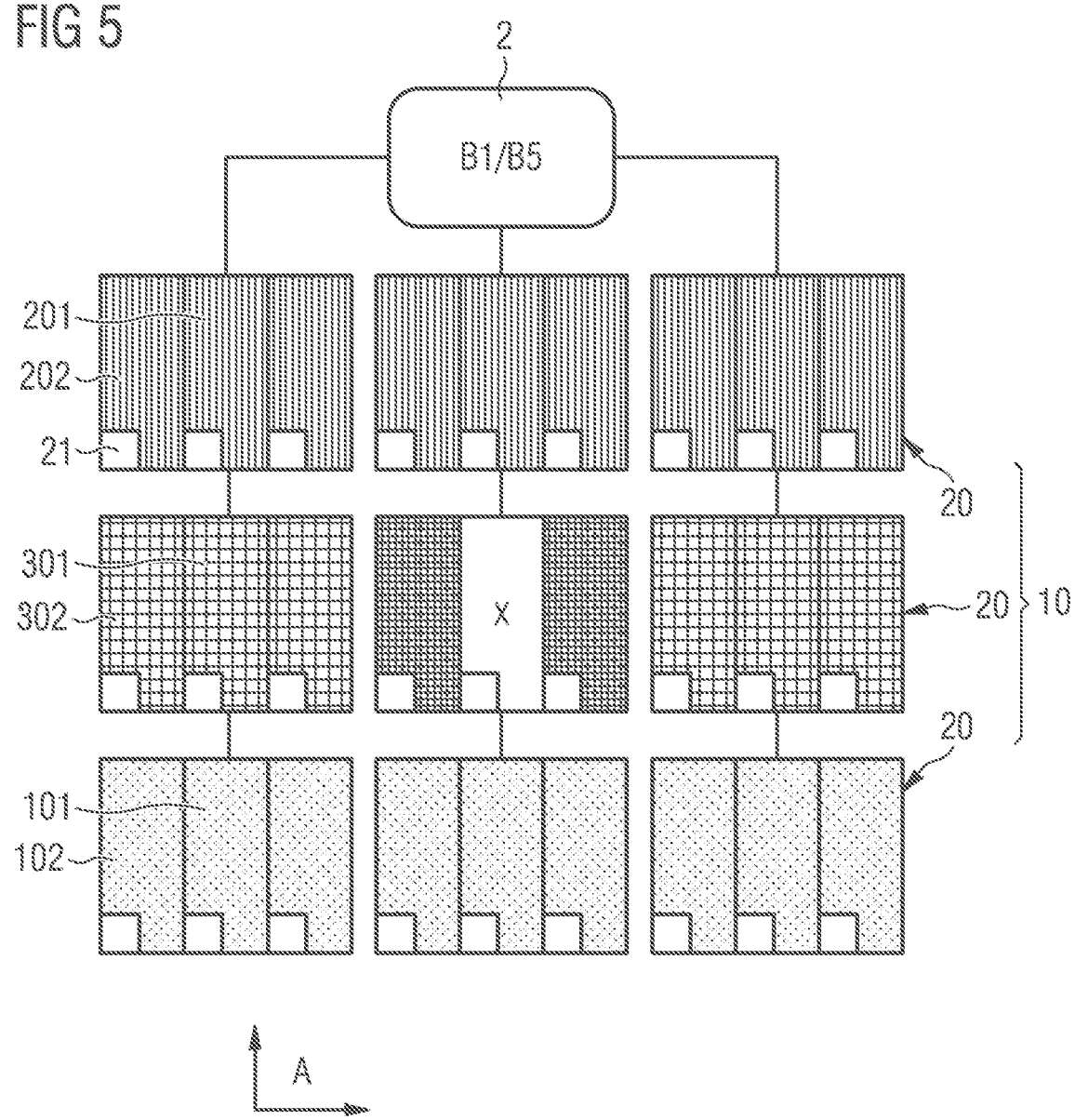

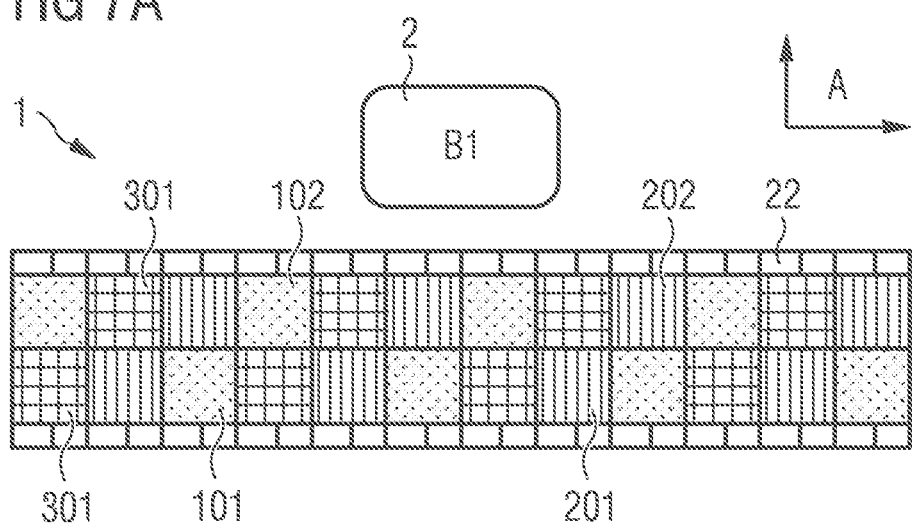
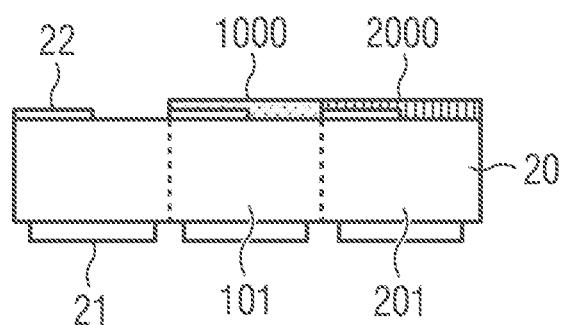

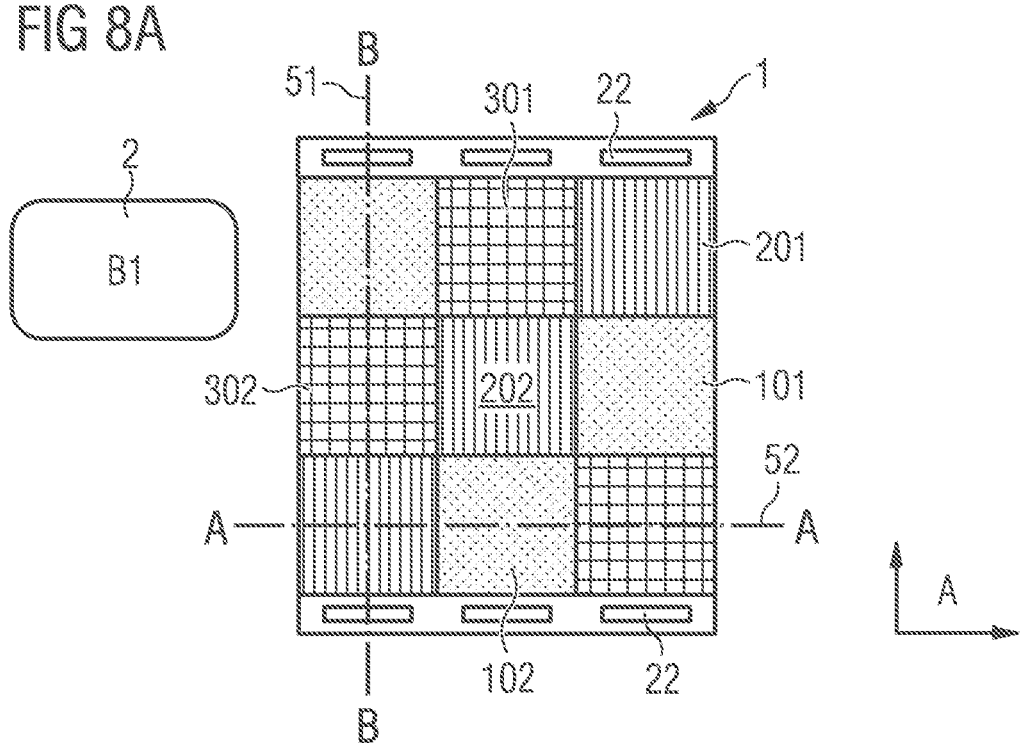
FIG 8A
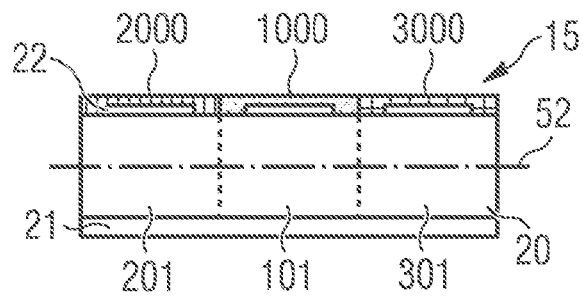
FIG 8B    A - A
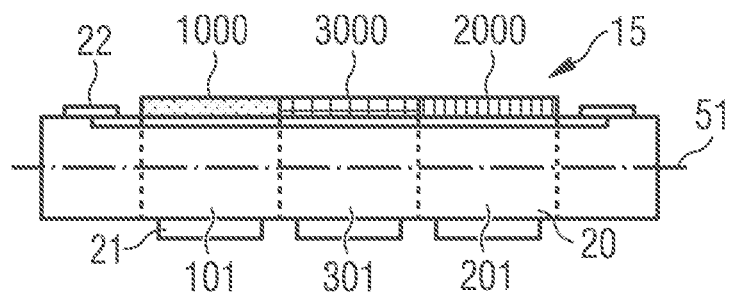
FIG 8C    B - B

LIGHT-EMITTING MODULE AND DISPLAY DEVICE COMPRISING SAME

This patent application is a national phase filing under section 371 of PCT/EP2017/057434, filed Mar. 29, 2017, which claims the priority of German patent application 10 2016 105 989.7, filed Apr. 1, 2016, each of which is incorporated herein by reference in its entirety.

TECHNICAL FIELD

A light-emitting module is provided.

SUMMARY OF THE INVENTION

Embodiments provide a light-emitting module which is particularly reliable and robust. Further embodiments provide a light-emitting module, which can be produced with a particularly high yield of functional light-emitting modules.

According to at least one embodiment of the light-emitting module, the light-emitting module comprises a plurality of emission regions, which are configured to emit light during operation. In this case, light is understood to mean electromagnetic radiation in the spectral range between UV radiation and infrared radiation, in particular visible light. The emission regions can be based, inter alia, on a semiconductor material, in particular on a nitride compound semiconductor material. In addition, the emission regions can comprise a luminescence conversion material.

The emission regions of the plurality of emission regions can be arranged at a distance from one another in a lateral direction. The lateral directions are those directions which run parallel to a main plane of extension of the module, hereinafter also referred to as the "lateral plane". For example, the emission regions can be arranged at the grid points of a regular grid, for example, a rectangular grid, within the framework of the production tolerance.

According to at least one embodiment of the light-emitting module, the plurality of emission regions comprises at least one first and at least one second emission region of a first type which emit light of a first color locus. The first and the second emission region of the first type are arranged laterally spaced apart from one another, wherein the first and the second emission region of the first type can be arranged laterally adjacent to one another.

According to at least one embodiment of the light-emitting module, the light-emitting module comprises at least one first and one second emission region of a second type which emit light of a second color locus. The first and the second emission region of the second type are arranged laterally spaced apart from one another, wherein the first and the second emission region of the second type can be arranged laterally adjacent to one another. The emission regions of the first type and of the second type are arranged laterally spaced apart from one another in the same lateral plane.

According to at least one embodiment of the light-emitting module, the light-emitting module comprises a control device for supplying the emission regions with current. The control device is electrically conductively coupled to the emission regions. The control device is arranged to operate emission regions separately from one another during operation. For this purpose, the control device can comprise, for example, a current or voltage source and control electronics.

According to at least one embodiment of the light-emitting module, the first color locus is different from the second color locus. In particular, it is possible for the emission regions to emit different types of light of different spectral colors.

According to at least one embodiment of the light-emitting module, the first and second emission region of the first type are adjacent to one another. "Adjacent to one another" in this context means, that the first and the second emission region of the first type are arranged at a distance from one another directly or indirectly next to one another in lateral directions. If the first and second emission region are arranged directly adjacent, no further emission region is arranged between the first and the adjacent second emission region in lateral directions. Between two directly adjacent emission regions, there is thus a straight connecting line in the lateral plane which does not cross through any further emission region. If the first and the second emission region are arranged indirectly adjacent to one another, a further emission region is arranged between the first and the adjacent second emission region in the lateral direction. The further emission region can be an emission region of a second or third type.

According to at least one embodiment of the light-emitting module, the first and the second emission region of the second type are adjacent to one another. "Adjacent to one another" in this context means, that the first and the second emission region of the second type are arranged at a distance from one another directly or indirectly next to one another in lateral directions. If the first and second emission region are arranged directly adjacent, no further emission region is arranged between the first and the adjacent second emission region in lateral directions. Between two directly adjacent emission regions, there is thus a straight connecting line in the lateral plane which does not cross through any further emission region. If the first and the second emission region are arranged indirectly adjacent to one another, a further emission region is arranged between the first and the adjacent second emission region in the lateral direction. The further emission region can be an emission region of a first or third type.

According to at least one embodiment of the light-emitting module, the control device is arranged to operate all emission regions separately from one another. Each emission region is electrically coupled to the control device separately from other emission regions. By means of the control device, all emission regions can be operated individually with a predetermined current and/or a predetermined voltage.

According to at least one embodiment of the light-emitting module, the control device is designed to redundantly operate the emission regions of the first type. In this case and in the following, "redundantly" means that, in the event of a defect of a first emission region of a specific type, a second emission region of the same type compensates for this defect and the first defective emission region is not operated by the control device. In the case of a defect of an emission region, an emission region of the same type thus takes over the function of the defective emission region.

According to at least one embodiment of the light-emitting module, the control device is designed to redundantly operate the emission regions of the second type.

According to at least one embodiment, a light-emitting module is provided, the light-emitting module comprising: a plurality of emission regions which are configured to emit light during operation, and comprise at least one first and one second emission region of a first type which emit light of a first color locus and at least one first and one second emission region of a second type which emit light of a second color locus, and a control device for supplying the emission regions with current, wherein a number of the emission regions are arranged on a common semiconductor chip, the first color locus is different from the second color locus, the first and second emission regions of the first type are adjacent to one another, the first and second emission regions of the second type are adjacent to one another, the control device is arranged to operate all emission regions separately from one another, the control device is designed to redundantly operate the emission regions of the first type, and the control device is designed to redundantly operate the emission regions of the second type.

A light-emitting module described here is based, inter alia, on the following considerations.

Light-emitting modules can comprise one or more image points. Each image point or pixel can in turn comprise one emission region of each type which are arranged adjacent to one another in the lateral plane. A defect of an emission region generally leads to the failure of the respective image point, that is to say that its function in the light-emitting module is not fulfilled further. For cost reasons, when a defect of an emission region occurs, this defect is usually not corrected, since analysis and processing costs would be too high.

In particular within the scope of the use of the light-emitting module as or in a display device, such as a so-called video wall, with a particularly small distance between individual image points, a plurality of image points may be arranged next to one another in a lateral plane. The emission regions of an image point can be part of a common or different light-emitting semiconductor chips. The different semiconductor chips are arranged at a distance from one another in the lateral plane and are connected, for example, by means of a planar connection. A subsequent correction of a defective emission region would only be possible with great effort. Depending on the requirements for a light-emitting module, the failure of individual image points can already be unacceptable.

It has now been found, surprisingly, that a targeted segmentation of individual image points can solve the above-mentioned problems. A segmented image point of a light-emitting module comprises at least two emission regions of each type which are arranged adjacent to one another. The two adjacent emission regions of the same type can be operated redundantly with respect to one another by means of the control device. The emission regions are dimensioned in such a way that the brightness of a single emission region is sufficient for the application of the light-emitting module. In addition, the lateral extent of an individual emission region is sufficiently small, so that the resolution of the emission regions is higher than the resolution of the image points which is required for the respective application. The individual emission regions can be operated separately from one another by means of the control device, so that in the event of a defect of a first emission region the latter is no longer operated and the adjacent second emission region of the same type is operated additionally or with a higher current.

Advantageously, defects of individual emission regions can be compensated by means of such a light-emitting module. As a result, a light-emitting module remains fully functional despite individual defective emission regions, which increases the yield of functional light-emitting modules during production and improves the reliability of them. In addition, testing and pre-sorting of the light-emitting semiconductor chips, from which the light-emitting modules are formed, can be avoided, which in turn reduces the production costs of the light-emitting module. Furthermore, in conventional light-emitting modules up to 50% of the surface is required for redundant emission regions. The segmentation of an emission region into a plurality of smaller emission regions which lie below the resolution limit required for the respective application enables a common redundant emission region to be used for a plurality of emission regions. A smaller proportion of the surface of the light-emitting module is thus advantageously required for redundant emission regions.

According to at least one embodiment of the light-emitting module, the control device is arranged to detect a defective emission region. A defective emission region has, for example, an erroneous electrical contact, so that the desired currents do not flow at a given voltage. For example, in the event of a defect of an emission region, the intended operation with small currents is not possible. Alternatively, the defect can occur in the form of a shunt, as a result of which the efficiency of the emission region is reduced on account of parasitic parallel currents.

The detection of a defective emission region by means of the control device can take place, for example, during the operation of the emission region. For example, the current voltage characteristic of each emission region is compared with a predetermined target value which is to be achieved in the intended state. Advantageously, defects of the emission regions can be detected immediately before or during operation, as a result of which testing of the emission regions can be avoided in the production process. This enables a particularly cost-effective production of the module.

According to at least one embodiment of the light-emitting module, the control device is arranged to not operate a defective emission region. The control device is arranged to operate all emission regions separately from one another. If an emission region is defective, the latter is not operated by the control device, which means, such that no voltage is applied to an emission region or the defective emission region is not supplied with current. The efficiency of the light-emitting module is advantageously increased if defective emission regions are not energized.

According to at least one embodiment of the light-emitting module, the control device is arranged to compensate for a defect of a first emission region of a type by means of operating a second emission region of the same type. In this case, the second emission region is operated in such a way that the defect of the first emission region is not perceptible to the viewer. For example, in the event of a defect of a first emission region, the second emission region can be operated with a current, with which the first emission region would be operated if the latter was not defective. The second emission region then emits, for example, light of the same color locus and the same brightness as the non-defective first emission region. The yield of functional light-emitting modules is advantageously increased by means of the compensation of defective emission regions, since light-emitting modules can be used in the intended operation despite defective emission regions. In addition, the compensation of defective emission regions increases the service life and the robustness of a light-emitting module.

According to at least one embodiment of the light-emitting module, the control device has a plurality of operating states. The operating state of the control device can, for example, be in direct connection therewith, whether a defective emission region is detected and in which manner the latter is compensated by the control device. The control device has a common operating state for emission regions which are operated redundantly with respect to one another.

The control device can be operated in different operating states at the same time for a plurality of groups of emission regions operated redundantly with respect to one another. For example, the control device can be operated in an operating state for emission regions of the first type which are operated redundantly with respect to one another and the control device can be operated in a different operation state for emission regions of the second type which are operated redundantly with respect to one another.

Furthermore, the control device can have operating states in which properties, for example, the low-current behavior, of individual emission regions are measured. In particular, these properties can be measured by means of the control device itself.

According to at least one embodiment of the light-emitting module, the control device operates the first emission region and the second emission region of the same type in a first operating state, wherein none of the emission regions is defective. In the first operating state, the first and the second emission region are supplied with current in a predetermined manner, so that these emit light as intended. For example, the first and the second emission region can be operated at a maximum of 50 percent of their maximum radiation power. Advantageously, neither the first nor the second emission region is operated at the maximum of its radiation power in the first operating state, as a result of which the service life of the individual emission regions is increased.

According to at least one embodiment of the light-emitting module, the control device does not operate the first emission region in a second operating state, wherein said first emission region is defective, and the control device operates the second emission region of the same type with a current, wherein the current is greater than a current, with which the second emission region of the same type is operated in the first operating state. In the second operating state, the second emission region is supplied with current in a predetermined manner, so that the latter emits light as intended. In the second operating state, the defect of the first emission region is compensated by means of supplying the second emission region with a greater current. For example, the second emission region is not operated with its maximum radiation power in the first operating state, so that in the event of a defect in the first emission region, the radiation power of the second emission region can be increased. The defect of a first emission region is advantageously compensated in the second operating state, so that the radiation power emitted by the light-emitting module is exactly as large as in the first operating state within a tolerance range. The defect of the first emission region is thus not perceptible to the viewer.

According to at least one embodiment of the light-emitting module, the control device operates the first emission region in a third operating state and does not operate the second emission region of the same type, wherein the first and the second emission region are not defective. In the third operating state, the second emission region is not supplied with current, so that the latter does not emit light. The first emission region is supplied with current in a predetermined manner, so that the latter emits light as intended. In the third operating state, neither the first nor the second emission region has a defect. The light-emitting module advantageously has a sufficiently high density of emission regions, so that it is sufficient, to operate only a part of the emission regions in order to achieve the desired radiation power.

According to at least one embodiment of the light-emitting module, the control device does not operate the first emission region and operates the second emission region of the same type in a fourth operating state, wherein the first emission region is defective. In the fourth operating state, no current is impressed into the first emission region by the control device, so that the latter does not emit light. In the fourth operating state, current is impressed into the second emission region, so that the latter emits light in a predetermined manner. In the fourth operating state, the first emission region is defective. Said defect of the first emission region is compensated by operating the second emission region. The radiation power and the color locus are thus advantageously the same in the first operating state and in the second operating state within a tolerance range. The second emission region is operated only if an associated first emission region of the same type is defective. As a result, the service life of the entire light-emitting module is increased.

According to at least one embodiment of the light-emitting module, the light-emitting module comprises at least one first and one second emission region of a third type which emit light of a third color locus, wherein the third color locus is different from the first and second color locus, the first and second emission regions of the third type are adjacent to one another, and the control device is designed to operate the emission regions of the third type redundantly. The emission regions of the third type can comprise all or a part of the mentioned features of the emission regions of the first and/or second type. The emission regions of the third type differ only in their color locus from the emission regions of the first and second type. Advantageously, by means of the emission regions of the first, of the second and of the third type a large part of the color space perceptible to the human eye can be displayed. For example, the first color locus is in the red wavelength range, the second color locus is in the green wavelength range and the third color locus is in the blue wavelength range. The light-emitting module is thus particularly suitable for use in a display device.

According to at least one embodiment of the light-emitting module, the module comprises a plurality of light-emitting semiconductor chips. The semiconductor chips can in particular be light-emitting diode chips. In this case, two or more emission regions of different types are arranged jointly on one of the semiconductor chips. The semiconductor chips are in turn arranged at a distance from one another in a lateral plane, so that emission regions, which are arranged on different semiconductor chips, are arranged in the same lateral plane.

The semiconductor chips each comprise a layer stack which is grown epitaxially. For example, the layer stack comprises a p-doped semiconductor layer, an n-doped semiconductor layer and an active layer, in which electromagnetic radiation in the visible region is generated during operation. In particular, an emission region comprises exactly one active layer which is configured to emit electromagnetic radiation. The active layer can comprise, for example, one, two or more quantum well layers which can be spaced apart from one another by barrier layers.

The plurality of emission regions of different types, which are arranged together on a semiconductor chip, are not arranged in direct contact with one another. In particular, at least the active layer and one doped layer of the semiconductor chip are severed transversely or perpendicularly to the lateral plane, so that each of the emission regions comprises a part of the active layer which is spaced and electrically separated, for example, by means of an electrically insulating material, from parts of the active layer which are associated with other emission regions of the semiconductor chip.

The electromagnetic radiation generated in the active layer during operation can, for example, be radiation of the first, second or third color locus such that said emission regions emit the electromagnetic radiation generated in the active layer. Emission regions which emit radiation of a color locus which does not correspond to the color locus of the radiation generated in the active layer comprise conversion layers which contain or consist of a luminescence conversion material. The conversion layers are arranged on the emission side of the semiconductor chip. The emission side is the side of the semiconductor chip through which a large part of the electromagnetic radiation is emitted during operation.

For example, the emission regions of the second type can comprise a conversion layer of a second type, by means of which the electromagnetic radiation, which is generated in the active layer during operation, is converted into radiation of a longer wavelength. Thus, light of the second color locus is emitted in regions in which the conversion layer of the second type is arranged. Analogously, emission regions of the third type can comprise a conversion layer of a third type, by means of which the electromagnetic radiation, which is generated in the active layer during operation, is converted into radiation of a longer wavelength. Thus, light of the third color locus is emitted in regions in which the conversion layer of the third type is arranged. Emission regions of the first type can comprise a conversion layer of a first type, by means of which the electromagnetic radiation generated in the active layer is converted into radiation of a longer wavelength range. Alternatively, the emission regions of the first type can be free of a conversion layer and, for example, emit the blue light directly generated in the active layer.

The emission regions of different types, which are arranged jointly on a semiconductor chip, comprise the same semiconductor layer stack. That means that the emission regions of different types are produced in the same epitaxial process step and the individual layers of the layer stack have the same material composition and the thicknesses of the individual layers of the layer stack of the emission regions of different types are identical. The emission regions can advantageously be arranged at a particularly small distance from one another in lateral directions, if they are arranged on a common semiconductor chip. For example, the distance in a lateral direction between two emission regions on a common semiconductor body can be smaller than 15 µm. In addition, the emission regions of the same type, which are arranged on a common semiconductor chip, emit radiation, whose color loci lie particularly close to one another or whose color loci are the same, since the production tolerances between the individual emission regions are particularly low.

In particular, a plurality of emission regions of a semiconductor chip can comprise a common continuous active region. The individual emission regions are then controlled separately from one another by means of separate contacts on the p-doped semiconductor layer. Due to the low transverse conductivity of the p-doped semiconductor layer, the extent of the emission regions in the lateral direction is defined by means of the contour of the electrical contact on the p-doped semiconductor layer.

Light-emitting semiconductor chips having a plurality of emission regions of different types, which can be followed by different conversion layers, are described in a different context in document WO 2015/024801 (see also U.S. Ser. No. 14/912,382) the disclosure content of which is hereby incorporated by reference.

According to at least one embodiment of the light-emitting module having a plurality of semiconductor chips, exclusively emission regions of one type are arranged on one of the semiconductor chips. The semiconductor chips can in particular be light-emitting diode chips. Two or more emission regions of the same type are arranged jointly on one of the semiconductor chips. The semiconductor chips are in turn arranged at a distance from one another in a lateral plane, so that emission regions, which are arranged on different semiconductor chips, lie in the same lateral plane.

The semiconductor chips each comprise a layer stack which is grown epitaxially. For example, the layer stack comprises a p-doped semiconductor layer, an n-doped semiconductor layer and an active layer, in which electromagnetic radiation in the visible region is generated during operation.

The emission regions of the same type, which are arranged jointly on a semiconductor chip, comprise the same semiconductor layer stack. That means that the emission regions of the same type are produced in the same epitaxial process step and the individual layers of the layer stack have the same material composition within a tolerance range. In addition, the thicknesses of the individual layers of the layer stack of the emission regions of the same type are the same within a tolerance range.

The plurality of emission regions of the same type, which are arranged together on a semiconductor chip, are not in direct contact with one another. In particular, the active layers of the emission regions are spaced apart from one another and are, for example, separated from one another by means of an electrically insulating material.

The emission regions can advantageously be arranged particularly close to one another when they are arranged on one semiconductor chip. In addition, the emission regions of the same type emit light the color locus of which differs particularly little, since the production tolerances between the individual emission regions of the same type are particularly low.

Emission regions of different types are advantageously arranged on different semiconductor chips in this embodiment. This means that the emission regions of different types can be produced separately from one another. Thus, the semiconductor chip with the properties, such as, for example, size and color locus, that are optimally suitable for the emission regions of the respective type can be used for the emission regions of each type.

According to at least one embodiment, the light-emitting module comprises a first emission region and two second emission regions of the same type which are adjacent to the first emission region. A defect of the first emission region can be compensated by means of the two second emission regions. The first emission region and the two second emission regions emit light of the same color locus within a tolerance range. For example, the first emission region can be arranged adjacent to the two second emission regions.

In order to compensate for a defective first emission region by means of two or more second emission regions of the same type, the control device is operated in a fifth operating state. In the fifth operating state, the second emission regions are operated in such a way, in that the second emission regions compensate for the defect of the first emission region. During the compensation, the corresponding second emission regions are operated with an increased radiation power, so that the defect of the first emission region is not perceptible.

Advantageously, the two second emission regions, which are used to compensate for a defective first emission region, can be operated with lower currents, than if a defective first emission region is only compensated by means of a single second emission region. As a result, the service life of the emission regions used for compensation is increased.

Alternatively, more than two emission regions of one type, which are arranged adjacent to a first defective emission region of the same type, can be used to compensate for the defect.

According to at least one embodiment, a common redundant second emission region of one type is assigned to a plurality of first emission regions of the same type, wherein the common redundant second emission region is of the same type as the plurality of first emission regions. For example, the sum of the second redundant emission regions is smaller than the sum of the first emission regions. Advantageously, the required number of redundant emission regions, which are kept available for the case of a defect, is thus kept low.

Furthermore, a display device is provided. The display device comprises in particular a light-emitting module described herein. This means that all the features described for the light-emitting module are disclosed for the display device and vice versa.

According to at least one embodiment, the display device comprises a light-emitting module as described herein, wherein an image point of the display device comprises a first and a second emission region of each type. The display device comprises a plurality of emission regions which are arranged next to one another in a lateral plane. An image point of the display device comprises a first and a second emission region of each type, such that each image point can be operated redundantly and the defect of a first emission region can be compensated by means of the associated second emission region of the same type.

Advantageously, a display device which comprises at least two emission regions of one type per image point is particularly robust and long-lived, since each image point of the display device can emit radiation as intended despite a defective emission region.

BRIEF DESCRIPTION OF THE DRAWINGS

The light-emitting module described herein and the display device described herein are explained in more detail below on the basis of exemplary embodiments and associated figures.

FIGS. 3A, 3B, 3C and 5 show schematic plan views of exemplary embodiments of a light-emitting module;

FIGS. 6A, 6B, 6C, 6D, 7A and 7B show schematic plan views and cut-away views of exemplary embodiments of a semiconductor chip having emission regions of first, second and third types, which can be used in embodiments of light-emitting modules and display devices;

FIGS. 8A, 8B and 8C show schematic plan views and cut-away views of exemplary embodiments of a light-emitting module.

Figure 1A:
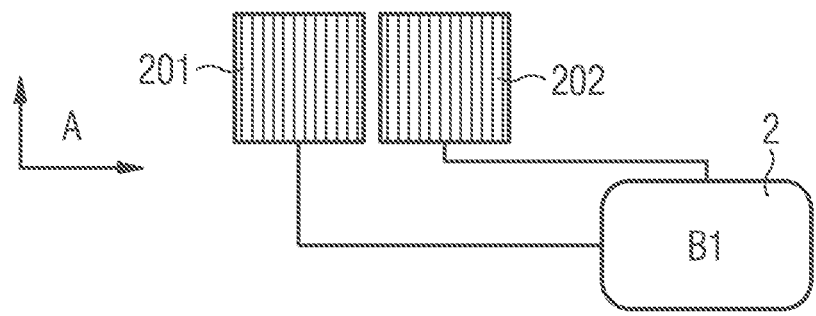
FIGS. 1A, 1B, 2A and 2B show emission regions in different operating states in schematic plan views for an exemplary embodiment of a light-emitting module of the control device.

Identical, similar or identically acting elements are provided with the same reference numerals in the figures. The figures and the size ratios of the elements illustrated in the figures among one another are not to be regarded as being to scale, except for units being expressly specified. Rather, individual elements can be represented with an exaggerated size for better representability and/or for better intelligibility.

DETAILED DESCRIPTION OF ILLUSTRATIVE EMBODIMENTS

Figure 1B:
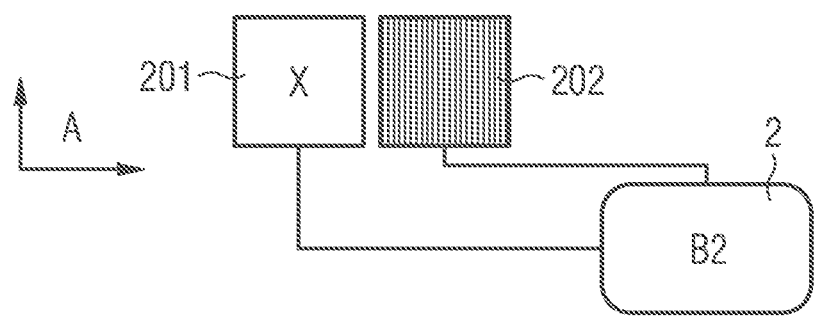

In connections with FIGS. 1A and 1B, a first concept for compensating a defective emission region according to an exemplary embodiment of a light-emitting module described here is illustrated. FIG. 1A shows a schematic plan view of a first 201 and a second emission region 202 of the same type. The emission regions 201, 202 shown have a square-shaped contour in the plan view and are arranged at a distance from one another in the lateral plane A. In the exemplary embodiment shown here, the first 201 and the second 202 emission region are operated redundantly with respect to one another by a control device 2. The control device 2 shown in FIG. 1A is in a first operating state B1. In this operating state B1, none of the emission regions has a defect and both emission regions are operated. For example, both emission regions are operated at 50 percent of their maximum radiation power.

FIG. 1B shows a schematic plan view of the first 201 and of the second 202 emission region of the same type, which are also shown in FIG. 1A. The first 201 and the second 202 emission regions are operated redundantly with respect to one another by means of the control device 2. The control device 2 shown in FIG. 1B is in a second operating state B2. In the second operating state B2, a defect of the first emission region 201 is detected. This defect is marked by an "X" in FIG. 1B. Due to the defect, the first emission region 201 is not operated by the control device 2. The second emission region 202 does not have a defect. Due to the defect of the first emission region 201, the control device 2 operates the second emission region 202 with a higher radiation power than in the first operating state B1. For example, the emission region is operated with its maximum radiation power. In this second operating state B2, the defect of the first emission region 201 is compensated by means of the second emission region 202 of the same type, so that the defect of the first emission region 201 is not perceptible to a viewer.

Figure 2A:
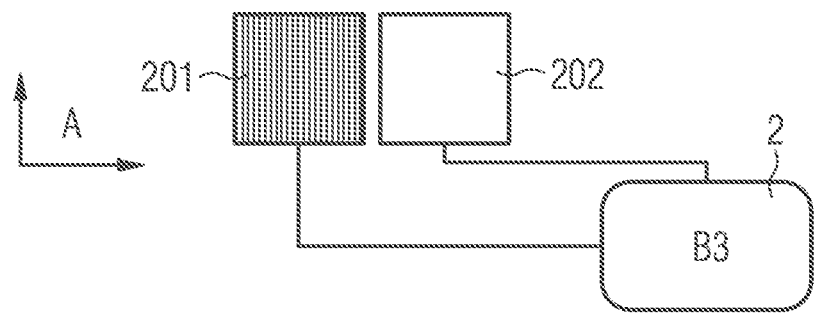
Figure 2B:
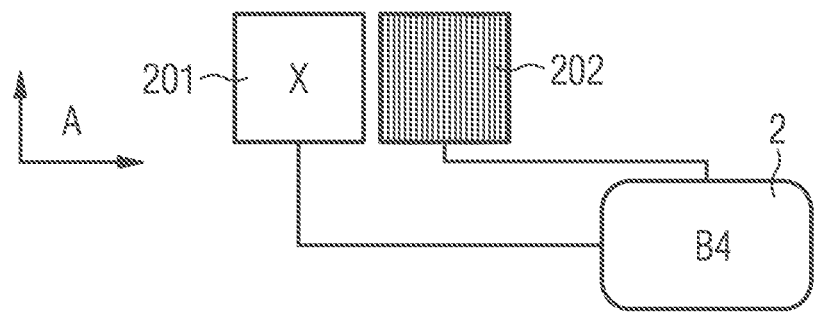

A second concept for compensating a defective emission region according to an exemplary embodiment of a light-emitting module described here is explained in FIGS. 2A and 2B. FIG. 2A shows a schematic plan view of a first emission region 201 and a second emission region 202, which are arranged at a distance from one another in the lateral plane A. The emission regions 201, 202 are operated redundantly with respect to one another by a control device 2. The control device 2 illustrated in FIG. 2A is in a third operating state B3. In the exemplary embodiment shown here, neither the first 201 nor the second emission region 202 has a defect. The first emission region 201 is operated, for example, with maximum radiation power. The second emission region is not operated.

FIG. 2B shows a schematic plan view of the first 201 and of the second 202 emission region, which are also shown in FIG. 2A. FIG. 2A shows emission regions 201, 202 which are operated redundantly with respect to one another by means of the control device 2. The control device 2 illustrated in FIG. 2B is in a fourth operating state B4. In this exemplary embodiment, the first emission region 201 has a defect which is detected by the control device 2. This defect is marked by an "X" in FIG. 2B. Due to the defect, the first emission region 201 is not operated by the control device 2. The defect is compensated by means of the operation of the second emission region 202, so that the defect of the first emission region 201 is not perceptible to a viewer. For example, in the fourth operating state B4 the second emission region 202 is operated with the same current as the first emission region 201 in the third operating state B3.

The emission regions shown in FIGS. 1A, 1B, 2A and 2B are operated redundantly with respect to one another by means of the control device 2 in the case of both concepts for compensating for a defective emission region. In the case of a defect of the first emission region 201 the second emission region 202 is operated in such a way that the defect of the first emission region 201 is compensated. For the compensation, the radiation power of the second emission region 202 is increased by the control device 2, such that the defect of the first emission region is not perceptible to a viewer.

The emission regions illustrated in FIGS. 1A, 1B, 2A, 2B can be part of a light-emitting module described here and of a display device described here and the emission regions can be arranged at a distance in a lateral plane A adjacent to further emission regions of the same or of a different type. The emission regions can have an arbitrary contour, for example, a circular or polygonal contour, in the lateral plane A.

Figure 3A:
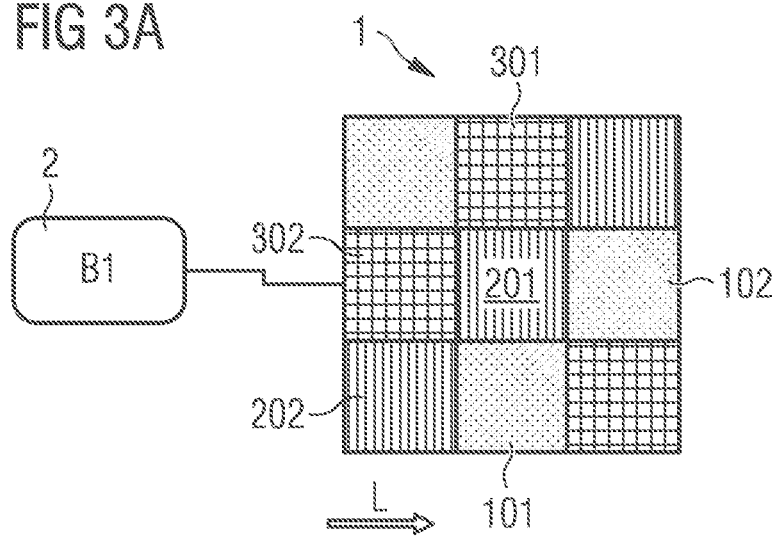

FIG. 3A shows a schematic plan view of a light-emitting module 1 described here according to a first exemplary embodiment. The light-emitting module 1 comprises nine emission regions which are arranged at the grid points of a regular rectangular grid. The emission regions are designed to emit light during operation. The emission regions comprise at least one first 101 and one second 102 emission region of the first type, which emit light of a first color locus and at least one first 201 and one second 202 emission region of the second type, which emit light of a second color locus. In addition, the light-emitting module 1 comprises a control device 2 for supplying the emission regions with current. The first color locus is different from the second color locus. The first 101 and the second 102 emission region of the first type are adjacent to one another, and the first 201 and second 201 emission region of the second type are adjacent to one another. The control device 2 is designed to operate all emission regions separately from one another. By means of the control device 2, the emission regions of the first type 101, 102 are operated redundantly with respect to one another and the emission regions of the second type 201, 202 are operated redundantly with respect to one another.

In the exemplary embodiment shown, none of the emission regions has a defect and the emission regions are not operated with their maximum radiation power. For example, the emission regions are operated at 50% of their maximum radiation power. For reasons of clarity, only a single electrically conductive connection between the emission regions and the control device 2 is illustrated, which, however, represents a separate electrically conductive connection of each individual emission region.

Figure 3B:
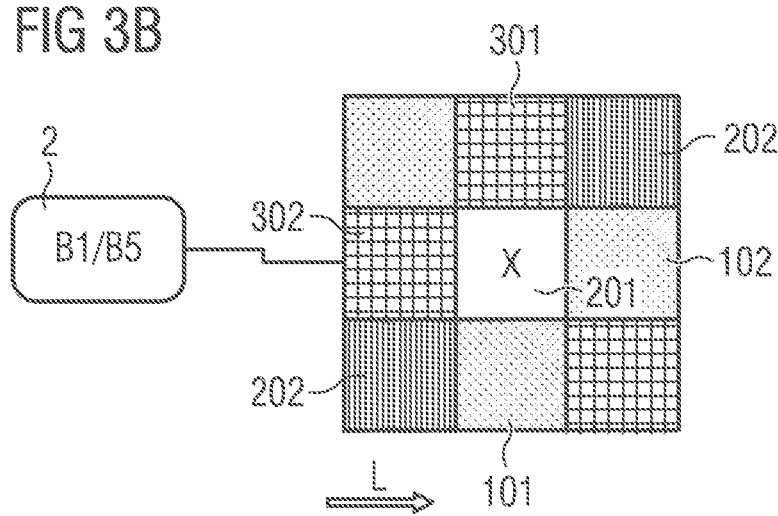

FIG. 3B shows a schematic plan view of the light-emitting module 1 described here according to the first exemplary embodiment. In contrast to the light-emitting module 1, which is illustrated in FIG. 3A, a first emission region of the second type 201 has a defect. The control device 2 is in the fifth operating state B5 for the redundantly operated emission regions of the second type 201, 202. In the fifth operating state B5, the defective emission region of the second type 201 is not operated by the control device. The defective emission region is identified by an "X" in FIG. 2B. The two adjacent second emission regions of the second type 202 are operated with an increased radiation power by means of the control device 2 in the fifth operating state B5 in order to compensate for the defect. The adjacent second emission regions of the second type 202 are, in the event of a defect of the first emission region, operated at a higher radiation power than without the defect of the first emission region. For example, the emission regions of the same type 202 adjacent to the defective emission region 201 are operated at 75% of their maximum radiation power in the fifth operating state B5 of the control device 2. For reasons of clarity, only a part of the electrically conductive connections between the emission regions and the control device 2 is illustrated.

The emission regions of the first 101, 102 and the third 301, 302 type have no defect and are operated in the first operating state by the control device 2.

Figure 3C:
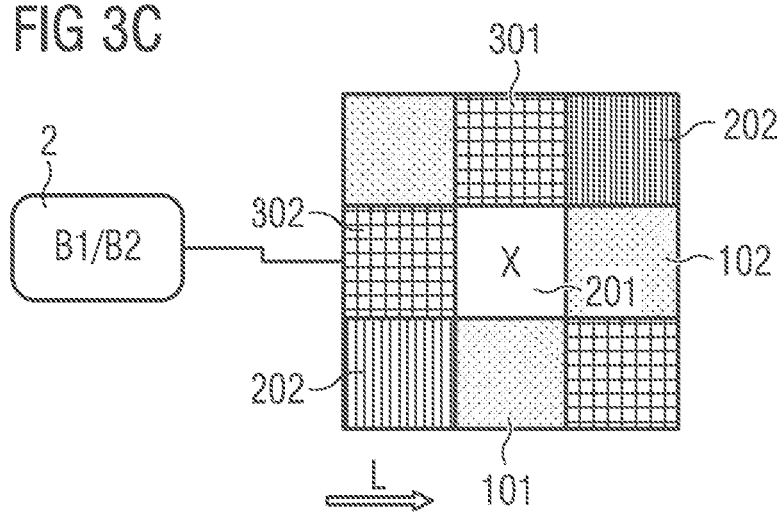

FIG. 3C shows a schematic plan view of a light-emitting module 1 described here according to the first exemplary embodiment. The first emission region of the second type 201 has a defect. The control device 2 is in the second operating state B2 for the redundantly operated emission regions of the second type 201, 202. In the second operating state B2, the defective emission region of the second type 201 is not operated by the control device. The defect of the emission region 201 is compensated by means of one of the adjacent second emission regions of the second type 202 by increasing the radiation power thereof. The radiation power of a further second emission region of the second type 202, which is also arranged adjacent to the defective emission region 201, is not increased in the second operating state B2 by means of the control device 2.

The emission regions of the first 101, 102 and the third 301, 302 type have no defect and are operated by the control device 2 in the first operating state. The defect of a first emission region 201 is compensated by means of a plurality of adjacent emission regions of the same type 202, when the control device 2 is in the fifth operating state B5, see FIG. 3B. Alternatively, the defect of a first emission region 201 is compensated by means of an adjacent emission region of the same type 202 when the control device 2 is in the second operating state, see FIG. 3C. Analogously, the defect of a first emission region of another type can be compensated by adjacent emission regions of this other type. For example, a defect of a first emission region of the first type 101 can be compensated by means of a higher radiation power of an adjacent or a plurality of adjacent second emission regions of the first type 102. Alternatively, the defect of a first emission region of the third type 301 can be compensated by means of the increased radiation power of an adjacent or a plurality of adjacent second emission regions of the third type 302.

Figure 4A:
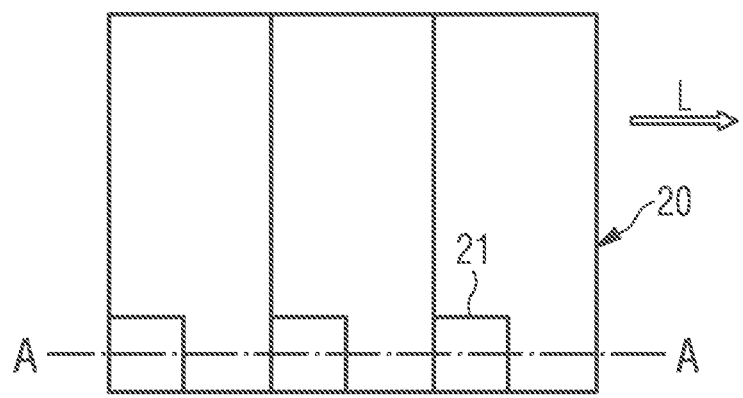
FIGS. 4A, 4B and 4C show schematic plan views and cut-away views of exemplary embodiments of a semiconductor chip having emission regions of one type, which can be used in embodiments of light-emitting modules described here and display devices.

FIG. 4A shows a schematic plan view of a semiconductor chip 20, which comprises three emission regions of the same type. The semiconductor chip 20 can be a part of a light-emitting module 1. The emission regions 201, 202 are arranged next to one another in a lateral direction L. Each of the emission regions comprises a first contact structure 21 by means of which the individual emission regions can be contacted and operated separately from one another. For example, the first contact structure 21 is arranged on the emission side 15 of the semiconductor chip 20, through which a large part of the radiation is emitted during operation. The emission regions are grown epitaxially on a common growth substrate in a common process.

Figure 4B:
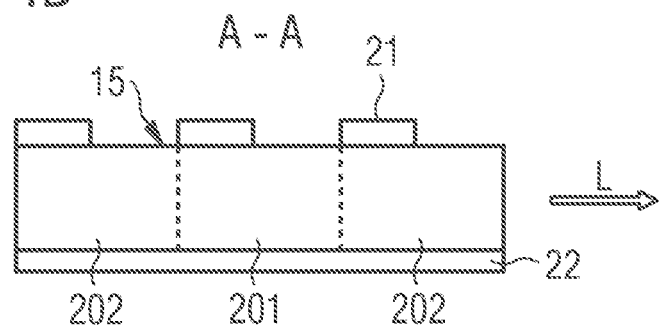

FIG. 4B shows a schematic cut-away view of a semiconductor chip 20 shown in FIG. 4A along the drawn line A-A. The emission regions 201, 202 comprise a common second contact 22 on their underside facing away from the first contact structure 21. By means of the second contact 22, all three emission regions 201, 202 are jointly electrically conductively contacted and operated.

Figure 4C:
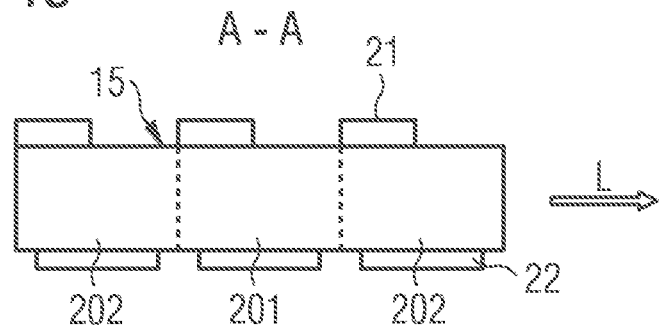

FIG. 4C shows a schematic cut-away view of an optoelectronic semiconductor chip described in FIG. 4A along the drawn line A-A. FIG. 4C shows an alternative embodiment to the embodiment in FIG. 4B. In contrast to the exemplary embodiment shown in FIG. 4B, the emission regions 201, 202 comprise separate second contacts 22, by means of which the emission regions 201, 202 can be electrically contacted and operated. The second contacts 22 are arranged on the side of the emission regions 201, 202 which faces away from the first contact 201.

FIG. 5 shows a schematic plan view of a light-emitting module 1, which is formed from a plurality of semiconductor chips 20. The semiconductor chips comprise either three emission regions of the first 101, 102, of the second 201, 202 or of the third 301, 302 type. The semiconductor chips 20 are arranged at a distance from one another in the lateral plane A. Three semiconductor chips 20 comprising emission regions of the first, of the second and of the third type form an image point of the light-emitting module 1.

In the exemplary embodiment shown, a first emission region of the third type 301 has a defect and is not operated by the control device 2 for this reason. The defective emission region is marked by means of an "X". The control device is in the fifth operating state B5 for the redundantly operated emission regions of the third type 301, 302, of which one of the emission regions has a defect. In order to compensate for the first defective emission region of the third type 301, the adjacent second emission regions of the third type 302 are operated with an increased radiation power. In particular, the second emission regions of the third type 302, which are adjacent to the defective emission region 301, are operated in such a way, that the semiconductor chip 20, which comprises a defective emission region 301, has the same radiation power within a tolerance range as the semiconductor chips 20 of the same type, which do not comprise a defective emission region. Thus, for example, in the case of a sufficiently small extent of the emission regions in the lateral plane A, the defective emission region is not perceptible to a viewer without technical aids.

Of the further emission regions, which are operated redundantly with respect to one another, no emission region has a defect. For these emission regions, the control device 2 is in the first operating state B1.

As an alternative to the exemplary embodiment shown in FIG. 5, a larger or a smaller number of identical emission regions can be arranged on a semiconductor chip 20. In addition, a light-emitting module 1 can comprise a larger or a smaller number of semiconductor chips 20. In general, emission regions of different types are preferably arranged adjacent to one another, so that they form an image point 10 with which different color loci can be displayed. In the present exemplary embodiment, an image point 10 comprises at least one first and two second emission regions of each type. Thus, in the event of a defect of one of the emission regions, an image point 10 can be functional without restriction, since the defect can be compensated by means of the adjacent emission regions of the same type.

Figure 6A:
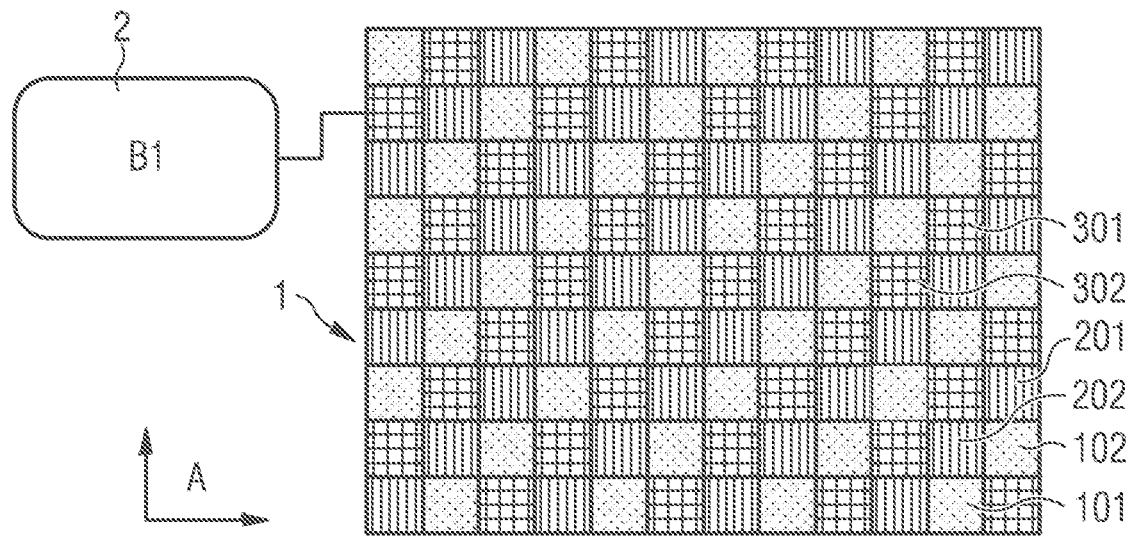

FIG. 6A shows a schematic plan view of an exemplary embodiment of a light-emitting module 1 having 144 emission regions, which are arranged next to one another in a lateral plane A. The emission regions are arranged on a common semiconductor chip 20. That is to say that the emission regions of different types are produced in a common process and comprise the same materials. The individual emission regions can be operated separately from one another. Apart from the emission regions which form the upper left-hand corner and the lower right-hand corner of the light-emitting module, all emission regions have an adjacent emission region of the same type.

In the exemplary embodiment shown, none of the emission regions of the semiconductor chip has a defect. All emission regions are operated by the control device 2 in the first operating state B1.

Alternatively, the regular rectangular grid can have more or less grid points on which the emission regions are arranged, so that the light-emitting module 1 comprises more or less columns and/or rows. In particular, the number of columns can be unequal to the number of rows.

Figure 6B:
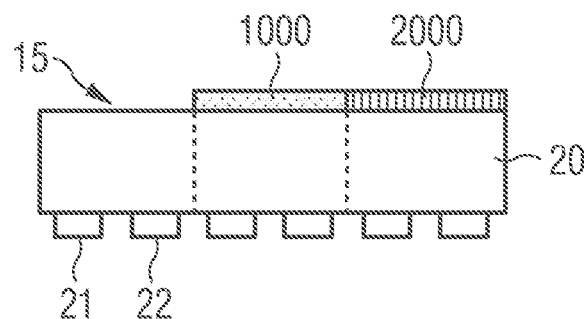
Figure 6C:
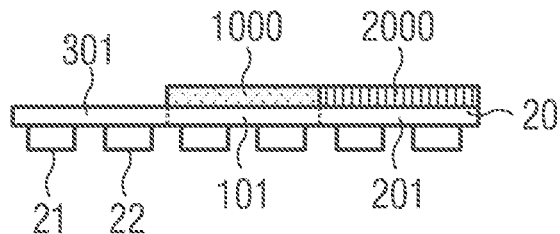
Figure 6D:
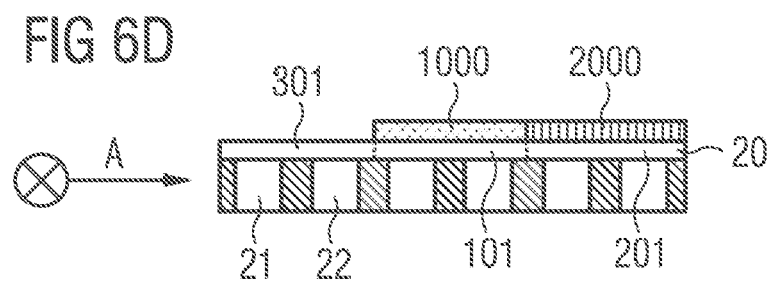

FIGS. 6B, 6C and 6D show cut-away views of alternative embodiments of the semiconductor chips 20 shown in 6A. The cut-away views each show only one first emission region of the first 101, the second 201 and the third 301 type of the semiconductor chip 1 shown in FIG. 6A.

FIG. 6B shows a semiconductor chip which has first 21 and second 22 contacts on its underside facing away from the emission side 15, by means of which the individual emission regions 101, 201, 301 of the semiconductor chip 20 can be electrically contacted and operated separately from one another. In the exemplary embodiment shown, the emission region of the first type 101 comprises a conversion element of a first type 1000, which converts the electromagnetic radiation generated in the semiconductor chip 20 into electromagnetic radiation of another wavelength range, so that radiation of the first color locus is emitted through the surface of the conversion element of the first type 1000 facing away from the semiconductor chip 20. In the present example, the emission region of the second type 201 comprises a conversion element of a second type 2000, which converts electromagnetic radiation generated in the semiconductor chip 20 into electromagnetic radiation of another wavelength range, so that radiation of the second color locus is emitted through the surface of the conversion element of a second type 2000 which faces away from the semiconductor chip 20. In this example, the first emission region of third type 301 does not comprise a conversion element. The electromagnetic radiation generated in the semiconductor chip 20 is emitted through the emission side of the third emission region without conversion. The electromagnetic radiation generated in the semiconductor chip 20 is thus radiation of the third color locus. Alternatively, the first emission region of the third type 301 can comprise a conversion element of a third type, which converts the electromagnetic radiation generated in the semiconductor chip into radiation of the third color locus.

FIG. 6C shows an alternative embodiment of the semiconductor chip 20 shown in FIG. 6B, which comprises a thinned substrate. The substrate can be thinned to at most 20% of its original thickness, for example. This enables, in particular, improved dissipation of heat generated during operation through the substrate.

FIG. 6D shows an alternative embodiment of the semiconductor chip shown in FIG. 6B, wherein an additional insulation material 25 surrounds the first contacts 21 and the second contacts 22 in the lateral plane A, and is cohesively connected to the underside facing away from the emission side 15 and to the side surfaces of the first 21 and second 22 contacts. The undersides of the first 21 and second 22 contacts facing away from the semiconductor chip 20 are free of the insulation material, so that the emission regions 101, 201, 301 can be electrically conductively contacted and operated by means of the first 21 and second 22 contacts. For example, the insulation material 25 serves for mechanically stabilizing the semiconductor chip 20.

FIG. 7A shows a light-emitting module 1, which comprises first 101, 201, 301 and second 102, 202, 302 emission regions of different types. The emission regions 101, 102, 201, 202, 301, 302 are arranged in two rows in a lateral plane A next to one another in a common semiconductor chip 20. A second contact structure 22 is arranged in each case in the lateral plane A adjacent to each emission region, by means of which the respective emission region adjacent to the second contact structure 22 can be contacted and operated.

The emission regions are electrically conductively connected to the control device 2, which is in the first operating state B1 for all emission regions. For reasons of clarity, the electrical connection between the control device 2 and the emission regions is not shown in FIG. 7A.

FIG. 7B shows a schematic cut-away view of a semiconductor chip constructed as in FIG. 7A, wherein in each case only one first emission region of the first 101, the second 201 and the third type 301 is shown. The first emission region of the first type 101 comprises a conversion element of the first type 1000, wherein electromagnetic radiation of the first color locus is emitted during operation through the side of the conversion element of the first type woo facing away from the semiconductor chip 20. The emission region of the second type 201 comprises a conversion element of the second type 2000, wherein electromagnetic radiation of the second color locus is emitted during operation though the side of the conversion element of the second type 2000 facing away from the semiconductor chip 20. The emission region of the third type comprises no conversion element, wherein electromagnetic radiation of the third color locus is emitted during operation through the emission side 15 of the first emission region of the third type 301. In the exemplary embodiment shown in FIGS. 7A and 7B, the semiconductor chip comprises second contact structures at its emission side and first contact structures at the opposite underside, via which the emission regions can be separately from one another electrically conductively contacted and operated.

FIG. 8A shows a schematic plan view of a further exemplary embodiment of a light-emitting module 1 described here. The light-emitting module comprises a first and a second emission region of the first 101, 102, the second 201, 202 and the third 301, 302 types. The emission regions are arranged next to one another in a lateral plane A. The light-emitting module 1 is formed from a single semiconductor chip 20. In the exemplary embodiment shown, three emission regions of different types are arranged along the drawn line B-B in one column 51. Orthogonally thereto in the lateral plane A, three emission regions of different types are arranged along the drawn line A-A in a row 52. The emission regions are electrically conductively connected to the control device 2, which is in the first operating state B1 for all emission regions. For reasons of clarity, the electrical connection between the control device 2 and the emission regions is not shown in FIG. 8A.

FIG. 8B shows a schematic cut-away view along the line A-A shown in FIG. 8A. The emission regions of one row 52 have a common first contact 21, which comprises exposed surfaces on the underside of the semiconductor chip 20 facing away from the emission side 15, via which the emission regions of one row can be electrically conductively contacted jointly. The emission regions of one row have separate second contacts 22, via which the latter can be electrically contacted separately. The emission regions of different types have a common semiconductor chip, on which, specific for each emission region, one conversion element of the first type 1000, one conversion element of the second type 2000 or one conversion element of the third type 3000 is arranged.

FIG. 8C shows a schematic cut-away view of the light-emitting module 1 shown in FIG. 8A along the drawn line B-B. The emission regions of the first 101, the second 201 and the third 301 type in one column have a common second contact 22, via which the emission regions can be electrically conductively contacted jointly. The emission regions of one column have separate first contacts, via which the latter can in each case be separately electrically conductively contacted and operated.

Figure 9:
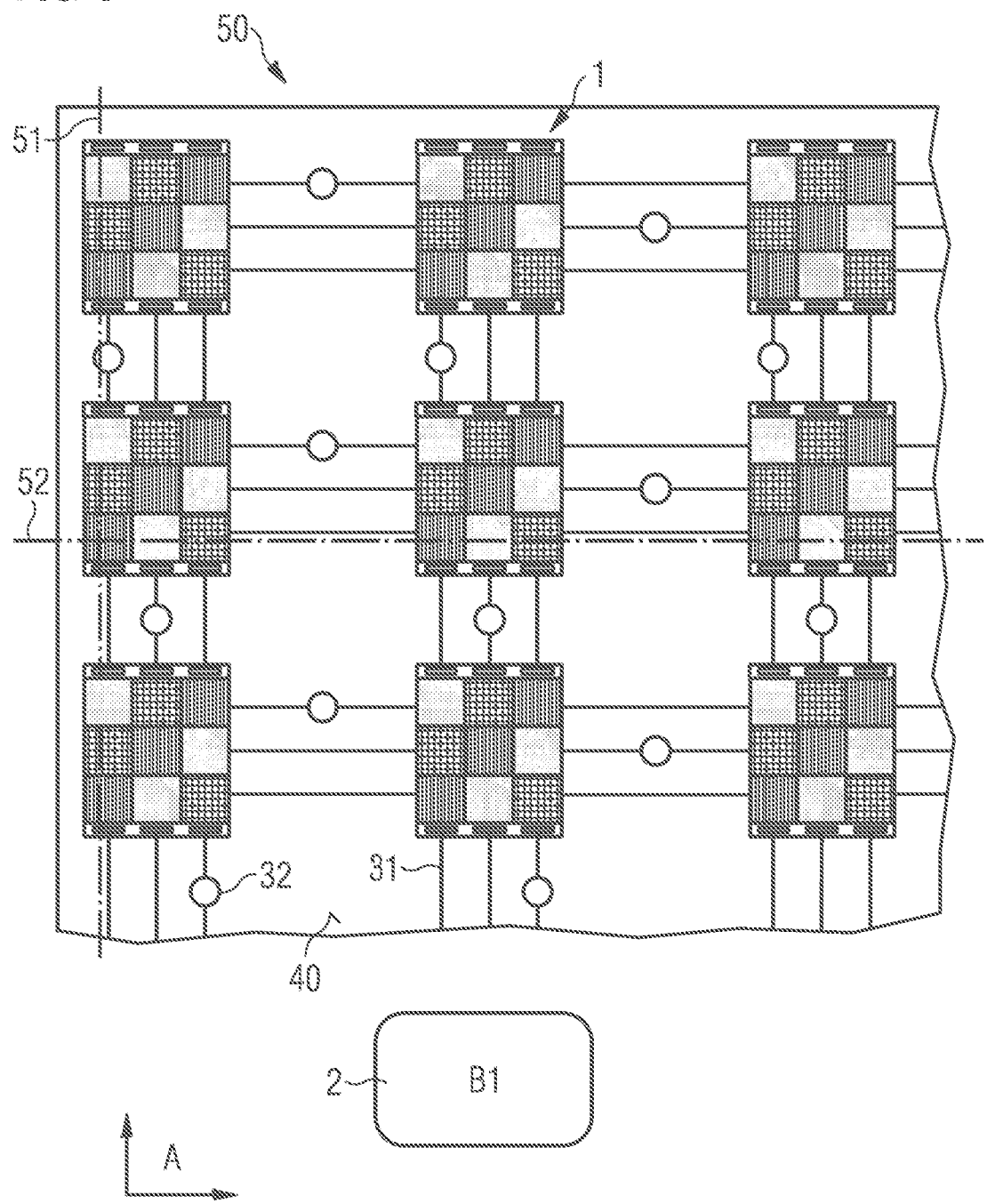
FIG. 9 shows a schematic plan view of an exemplary embodiment of a display device, which comprises a plurality of light-emitting modules.

FIG. 9 shows a schematic plan view of a display device 50, which comprises a plurality of light-emitting modules 1 as shown in FIG. 8A. The light-emitting modules 1 are arranged in a lateral plane A at a distance from one another on a carrier 40 at the grid points of a regular rectangular grid, that is to say in columns 51 and lines 52. The carrier 40 can be a printed circuit board which can comprise a base body made of a plastic material or a ceramic material. The individual light-emitting modules 1 are connected electrically conductively to one another by means of wire bonding or by means of planar interconnects 31. In this case, the emission regions arranged in one column 51 are electrically conductively connected to one another and the emission regions arranged in one row 52 are electrically conductively connected to one another. By means of plated-through holes 32 in the carrier 40, the light-emitting modules 1 can be electrically conductively contacted from the rear side facing away from the light-emitting modules 1 and can be operated by means of the control device 2.

The invention is not restricted to the exemplary embodiments by the description of the exemplary embodiments. Rather, the invention encompasses any new feature and also any combination of features, which includes in particular any combination of features in the patent claims, even if this feature or this combination itself is not explicitly specified in the patent claims or in the exemplary embodiments.

The invention claimed is:
1. A light-emitting module comprising:
a plurality of emission regions configured to emit light;
at least one first emission region and at least one second emission region of a first type configured to emit light of a first color locus and at least one first emission region and at least one second emission region of a second type configured to emit light of a second color locus; and
a control device for supplying the emission regions with current,
wherein the emission regions are arranged on a common semiconductor chip, wherein the first color locus is different from the second color locus, wherein the first and second emission regions of the first type are adjacent to one another, wherein the first and second emission regions of the second type are adjacent to one another, wherein the control device is configured to operate all emission regions separately from one another, wherein the control device is configured to redundantly operate the emission regions of the first type, wherein the control device is configured to redundantly operate the emission regions of the second type, and wherein the control device is configured to detect a defective emission region.

2. The light-emitting module according claim 1, wherein the control device is configured to not operate the defective emission region.

3. The light-emitting module according to claim 1, wherein the control device is configured to detect a defect of a first emission region of one type by operation of a second emission region of the same type.

4. The light-emitting module according to claim 1, wherein the control device has a plurality of operating states.

5. The light-emitting module according to claim 4, wherein the control device is configured to operate the first emission region and the second emission region of the same type in a first operating state when none of the emission regions is defective.

6. The light-emitting module according to claim 4, wherein the control device is configured to not operate a first emission region in a second operating state when this emission region is defective, and wherein the control device is configured to operate a second emission region of the same type with a current, wherein the current is greater than a current, with which the second emission region of the same type is operated in a first operating state.

7. The light-emitting module according to claim 4, wherein the control device is configured to operate a first emission region in a third operating state and to not operate a second emission region of the same type when the first and second emission regions are not defective.

8. The light-emitting module according to claim 4, wherein the control device is configured to not operate a first emission region in a fourth operating state and to operate a second emission region of the same type when the first emission region is defective.

9. The light-emitting module according to claim 1, wherein the light-emitting module comprises at least a first and a second emission region of a third type configured to emit light of a third color locus, wherein the third color locus is different from the first and second color locus, wherein the first and second emission regions of the third type are adjacent to one another, and wherein the control device is configured to operate the emission regions of the third type in a redundant manner.

10. The light-emitting module according to claim 1, wherein the light-emitting module comprises a plurality of semiconductor chips, wherein a number of emission regions of different types are arranged jointly on one of the semiconductor chips.

11. The light-emitting module according to claim 1, wherein the light-emitting module comprises a plurality of semiconductor chips, wherein exclusively the emission regions of one type are arranged on one of the semiconductor chips.

12. The light-emitting module according to claim 1, wherein the light-emitting module comprises a first emission region and two second emission regions of the same type which are adjacent to the first emission region.

13. The light-emitting module according to claim 1, wherein the light-emitting module comprises a number of first emission regions of the same type which are associated with a common redundant second emission region of this type.

14. A display device comprising:

the light-emitting module according to claim 1, wherein an image point comprises a first emission region and a second emission region of each type.

15. A light-emitting module comprising:

a plurality of emission regions configured to emit light;

at least one first emission region and at least one second emission region of a first type configured to emit light of a first color locus and at least one first emission region and at least one second emission region of a second type configured to emit light of a second color locus; and a control device for supplying the emission regions with current, wherein the emission regions are arranged on a common semiconductor chip, wherein the first color locus is different from the second color locus, wherein the first and second emission regions of the first type are adjacent to one another, wherein the first and second emission regions of the second type are adjacent to one another, wherein the control device is configured to operate all emission regions separately from one another, wherein the control device is configured to redundantly operate the emission regions of the first type, and wherein the control device is configured to redundantly operate the emission regions of the second type.

* * * * *